United States Patent [19]

Oguni et al.

[11] Patent Number: 4,917,877

[45] Date of Patent: Apr. 17, 1990

[54] PROCESS FOR PRODUCING ALUMINUM NITRIDE POWDER

[75] Inventors: Masanory Oguni; Hachiro Ichikawa; Akira Murase; Hiroo Ozawa, all of Shizuoka; Akihiko Tsuge, Kanagawa, all of Japan

[73] Assignee: Nippon Light Metal Co., Ltd., Tokyo, Japan

[21] Appl. No.: 258,256

[22] Filed: Oct. 14, 1988

[30] Foreign Application Priority Data

Oct. 14, 1987 [JP] Japan .................................. 62-257358
Dec. 16, 1987 [JP] Japan .................................. 62-316329

[51] Int. Cl.$^4$ .......................................... C01B 21/072
[52] U.S. Cl. .................................................. 423/412
[58] Field of Search ........................................ 423/412

[56] References Cited

U.S. PATENT DOCUMENTS 3,572,992  3/1971  Komeya et al. ..................... 423/412
4,784,839  11/1988  Bachelard et al. .................. 423/290

FOREIGN PATENT DOCUMENTS 91019    5/1983  Japan ................................. 423/412
178409   8/1986  Japan ................................. 423/412
23544    of 1912  United Kingdom ................ 423/412

Primary Examiner—Gary P. Straub
Assistant Examiner—Wayne A. Langel
Attorney, Agent, or Firm—Sughrue, Mion, Zinn, Macpeak & Seas

[57] ABSTRACT

A process for producing aluminum nitride powder by reacting nitrogen gas with a mixture of alumina and carbon is disclosed, in which a solid organic compound is added to the mixture.

7 Claims, 1 Drawing Sheet

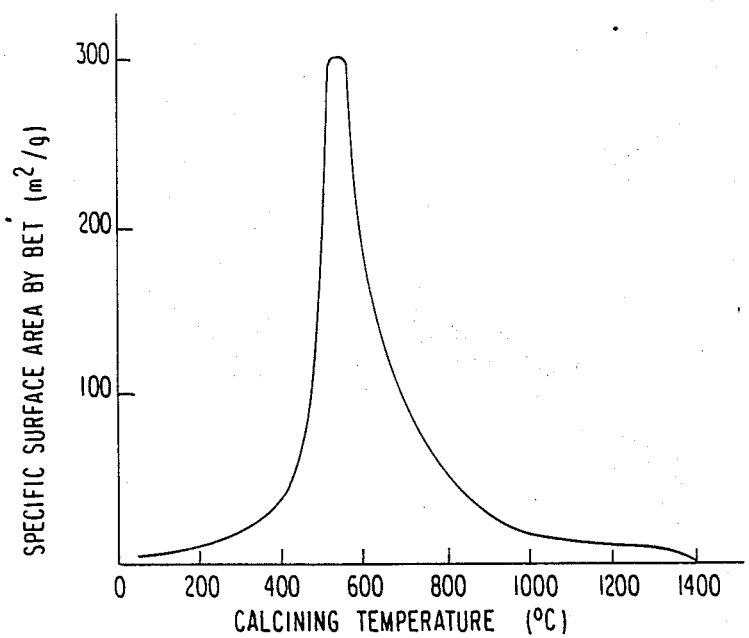
FIG.1
FIG.2
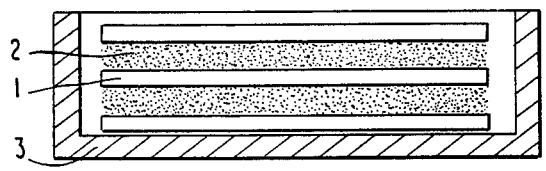

PROCESS FOR PRODUCING ALUMINUM NITRIDE POWDER

FIELD OF THE INVENTION

The present invention relates to a process for producing a novel aluminum nitride powder which has extremely fine particles with low oxygen content, which enables quick reaction.

BACKGROUND OF THE INVENTION

Because of its high thermal conductivity, the application of aluminum nitride to electronic industry materials, such as electrical substrates having high thermal conductivity and heat radiating parts, has become of great interest.

Conventional processes for producing aluminum nitride powder include those disclosed, for example, in JP-A-61-178409 and JP-A-60-176910 (the term "JP-A" as used herein means an "unexamined published Japanese patent application"). According to the former method, a resin powder comprising nitrogen atoms is added to a powder mixture of alumina and carbon, and the resulting mixture is subjected to reduction nitridation to produce aluminum nitride free from alumina and aluminum oxynitride. The latter discloses a method in which the alumina powder is previously brought into contact with a solution of an organic compound which would give carbon under the reaction conditions.

There remains, however, problems in the above described methods. JP-A-61-178409 describes that the purpose of mixing the resin powder is to give highly pure aluminum nitride free from alumina and aluminum oxynitride. To this end, the resin to be used necessarily contains nitrogen atoms. This method, however, is not suitable for the production of fine aluminum nitride having excellent sinterability capable of effecting reaction at high rate. The method disclosed in JP-A-60-176910 uses organic polymers in solution, therefore, the organic polymers to are employed be dissolved in a solvent such as water, ethanol, acetone, and ether. This requires additional steps such as drying or carbonization prior to the nitridation reduction, resulting in complicated operation which is unfavorable from the economical viewpoint and also from the safety viewpoint. Moreover, it is necessary to maintain the reaction system at a high temperature for a long time to complete the reaction.

SUMMARY OF THE INVENTION

The present invention intends to resolve the aforesaid problems by providing a process for producing a novel aluminum nitride powder that has fine particles low in oxygen content and effects quick reaction, which is suitable for producing sinterings having high thermal conductivity. The operation is also simplified in that there can be expected additional effects such as cost reduction and improvement in safety.

It has been found that the object of the present invention is attained by a process for producing aluminum nitride powder by reacting nitrogen gas with a mixture of alumina and carbon, characterized in that a solid organic compound is added to the mixture.

BRIEF DESCRIPTION OF THE DRAWINGS

FIG. 1 shows an example of the change in specific surface area at the thermal treatment of aluminum hydroxide.

FIG. 2 shows a cross-sectional view of the tray described in Example 6 mounting the starting material, wherein (1) represents a foamed sheet made of phenol-formaldehyde resin, (2) represents a starting powder material, and (3) represents a tray.

DETAILED DESCRIPTION OF THE INVENTION

The invention is described in further detail hereinafter.

It is well known that a mixture of alumina and carbon produces aluminum nitride and carbon monoxide by heating at 1400° C. or higher in an inert gas atmosphere containing nitrogen according to the equation (1) as follows.

$$Al_2O_3 + 3C + N_2 = 2AlN + 3CO \qquad (1)$$

In an intensive study of the present inventors with respect to the process for producing aluminum nitride powder having excellent sinterability and also effecting reaction at high rate, it is found that including one more steps to add a solid organic compound to the mixture prior to the reaction is extremely effective to achieve the object of the present invention.

Solid organic compounds referred in the present invention include phenol-formaldehyde resin, polyvinylidene chloride, polyphenylene, and cellulose, which are characterized in that they carbonize upon heating while maintaining a solid phase or via a gas phase without transforming into a liquid. Said compounds never experience an obvious liquid phase but carbonize maintaining a solid phase or via a gas phase to give a non-graphitizing carbon. The addition amount of the solid organic compound is from 5 parts by weight to 25 parts by weight per 100 parts by weight of alumina powder. Unfavorable results appear when the addition is less than 5 parts by weight, since large aggregates form in the aluminum nitride and much time is needed to complete the reaction. When the addition exceeds 25 parts by weight, on the other hand, it does form fine-grained aluminum nitride powder, however, it is also unfavorable from the economical viewpoint since the reaction is not effective, that is, excess carbon which does not lead to the formation of the aluminum nitride is produced. The organic compound to be used here is commonly in the form of fine powder, which is added to the mixture of alumina and carbon and homogeneously mixed to effect reaction. Alternatively, the mixture of alumina and carbon may be loaded on a thin foamed sheet or film of organic compounds, or filled in-between the laminates of said thin foamed sheets or films and then reaction effected.

The nitridation reduction reaction is successfully effected using a conventional synthetic furnance by heating in a temperature range of from 1250° C. to 1600° C. for 5 to 30 hours in an inert gas atmosphere.

Fine aluminum nitride improved in sinterability can be produced in a reduced reaction time by addition of solid organic compound as above. The reason for this is not yet made clear, but a possible explanation can be given as follows.

That is, said solid organic compounds are dehydrogenated at the initial stage of heating, followed by the evolution of gases such as CO, $H_2$, and $CH_4$. Thus, solid organic compounds are finally converged to what we call "soots" which is generally generated via the gas phase. It is noted that these soots consist of non graphitizing carbons which have extremely short intermolecular bondings and no preferred orientation. It is well-known that those particles are as fine as to the units of Angstrom, and that they are highly active powders having micro pores. They are, therefore, different from the graphitizing carbon as disclosed in, e.g., said JP-A-60-176910, which is formed from organic compounds such as sucrose and starch via a liquid phase.

As a result of the intensive investigation of the present inventors on the production of aluminum nitride, it is found that inhibition of the particle growth of alumina as well as employing fine alumina are important for producing fine aluminum nitride. This is because the growth of alumina particles begins at temperatures lower than the temperature at which reaction (1) takes place, i.e., in the range from 1,100° C. to 1,250° C.

As the equation (1) implies, the nitridation reduction reaction of solid alumina and solid carbon involves nitrogen gas, therefore, it proceeds faster if the distance between the solid particles is shortened.

Additionally, the starting material in the present invention comprises a number of pores about 10 to 1000 Angstroms in size on the surface thereof which function as paths through which water dissipates. It is clarified that the specific surface area (measured by the BET method) is related to the number and size of the pores. That is, as the specific surface area (by BET) gets bigger, the number of the pores increases and the depth of the pores gets larger. On the contrary, as the specific surface area gets smaller, the number of the pores decreases and the depth of the pores is reduced by the disappearance of the pores and its combination. Heating to temperatures as low as from 120° C. to 200° C. is insufficient to remove adsorbed water, since it is believed that said water is entrapped deep inside the pores.

In the present invention, alumina having a specific surface area (by BET) of from 20 $m^2/g$ to 130 $m^2/g$ with adsorbed water of 5.5% weight or less is preferred. When the specific surface area (by BET) and the adsorbed water of the alumina both exceed their upper limits, i.e., 130 $m^2/g$ and 5.5% by weight, unfavorable coarse aluminum nitride particles with a high oxygen content are obtained. When the specific surface area (by BET) is less than 20 $m^2/g$ and adsorbed water is contained beyond 5.5% by weight, a longer reaction time is necessary for the nitridation reduction reaction and the resulting aluminum nitride is high in oxygen content.

The oxygen content of the aluminum nitride powder depends on the strong affinity between the components of the aluminum nitride, i.e., aluminum and oxygen. Therefore, it is supposed that the oxygen content in the aluminum nitride powder lowers with decreasing oxygen partial pressure at the nitrogen reduction step. The oxygen partial pressure, on the other hand, lowers with decreasing amounts of adsorbed water.

Alumina obtained by heat treatment of aluminum hydroxide as in a conventional method can be employed in the present invention. In preparing alumina from aluminum hydroxide, a dehydration reaction takes place in that water of crystallization is removed, and α-alumina is finally obtained by way of various types of alumina (e.g., κ-alumina, γ-alumina, δ-alumina, etc.).

The alumina to be suitably used in the invention having a specified specific surface area (by BET) and adsorbed water content may easily be obtained by properly controlling the heating conditions.

FIG. 1 illustrates an example showing the change of specific surface area (by BET) of an aluminum hydroxide (BHP 39, manufacture by Nippon Light Metal Co., Ltd.) with the temperature of calcining under dry air. Measurement of the specific surface area by the BET method was performed on a specific surface area automatic measuring apparatus. (Type 2,200, manutactured by Shimadzu Corp.)

The water adhered on the alumina refers to the water adsorbed due to the active surface. The amount of adsorbed water is determined by calculating from the loss in weight after firing to 1,100° C., according to the method specified in JIS-H-1901-80.

In order to sufficiently obtain fine particles of aluminum nitride, fine powders such as carbon black and graphite are employed.

The reason why fine aluminum nitride is obtained by the present method can be explained as follows. First, ultrafine powder of carbon is formed by the addition of said solid organic compound to the mixture of alumina and carbon, and then, this carbon is distributed deeply into the micro pores of said alumina until the alumina is completely covered with carbon. This avoids contact between the alumina particles and results in preventing bonding of the particles at high temperatures. Even in commercially available fine carbon, the particle diameter is several milli-micrometers at the minimum, and it is impossible to cover completely the surface of alumina and into the inside of the pores. The carbon produced by firing said solid organic compound, on the contrary, is characterized in that it is non-graphitizing carbon with a short bonding length and having no preferred orientation. Therefore, it not only easily diffuses into the pores but also easily reaches the grain boundaries and prevents aggregation of the alumina particles. This effectively produces aluminum nitride powder having a uniform grain size. In addition, it can be considered that the reaction of eg. (1) proceeds at a high rate, because there is highly active non graphitizing carbon around the alumina particles.

Further, in the process of the present invention, an aluminum nitride powder extremely low in cation impurities can be obtained by, further including a step in which the mixture of alumina and carbon is brought into contact in a temperature range of 1,000° C. to 1,400° C. under the pressure of 0.1 atom or lower as described in Japanese Patent Application No. 75985/87.

The present invention is further explained with non-limiting examples and comparative examples. The results are given in Table 1.

EXAMPLES 1 TO 5

Alumina powder having an average particle size of 1.0 μm (determined by the electron microscope), a specific surface area of 46 $m^2/g$ (by BET method), and a water content, (adsorbed water) of 1.2% by weight was employed. The alumina was prepared by calcining in a dry air atmosphere a commercially available aluminum hydroxide (BHP 39 of Nippon Light Metal Co., Ltd.). A prescribed amount of solid organic compound was added to the powder mixture comprised of 100 g (100 parts by weight) of the aforesaid alumina powder and 40 g (40 parts by weight) of carbon powder of 25 μm in particle diameter, mixed in a ball mill for 24 hours, and charged on a carbon tray 210 mm×250 mm×40 mm). The starting material was fed at 30 mm in thickness. The tray was placed in an electric furnace having effective dimensions of 230 m×250 mm×220 mm, and the nitridation reaction effected under normal pressure with a nitrogen gas flow. The temperature was raised to 1,550° C. in the rate of 100° C./hr and held for 10 hours. The carbon at excess was removed by oxidation after completion of the reaction.

The particle size (average particle size) of the aluminum nitrate powder was measured by means of a photo extinction analyzer (SKN 1000 type of Seishin Kigyo, Co., Ltd.).

The unreacted $\alpha$-$Al_2O_3$ expressed in percent by weight in the total powder after removing excess carbon by oxidation was taken as an index for indicating the reaction rate. The unreacted $\alpha$-alumina was quantitatively determined by X-ray diffraction and the oxygen content in aluminum nitride was determined by X-ray spectrometry (System 3070 of Rikadenki Kogyo Co., Ltd.)

EXAMPLE 6

A powder mixture, which was mixed in a ball mill for 24 hours, comprising 500 g (100 parts by weight) of the alumina powder and 200 g (40 parts by weight) of the carbon powder as used in Examples 1 to 5 was sandwiched by three foamed sheets of phenol-formaldehyde resin (having a bulk specific gravity of 0.4) of 2 mm in thickness each and amounting to 85 g (17 parts by weight) in total to give a laminate structure as shown in FIG. 2. The laminate was then loaded on a carbon tray (210 mm×210 mm×80 mm), and subjected to nitridation reaction in the same manner as employed in Examples 1 to 5. The particle size, amount of $\alpha$-alumina, and the oxygen content were similarly determined.

EXAMPLE 7

An alumina powder having a specific surface area (by BET) of 27 $m^2$/g and a water content (adsorbed water) of 0.8% by weight was used for the starting material to obtain the aluminum nitride powder. The alumina powder was prepared by calcining in dry air a commercially available aluminum hydroxide (BHP 39 of Nippon Light Metal Co., Ltd.).

To the alumina powder was added 6 parts by weight of phenol-formaldehyde resin as the solid organic compound and the same maintained at 1,550° C. for 22 hours. The rest of the process followed the same manner as employed in Examples 1 to 5.

EXAMPLE 8

The same procedure as Examples 1 to 5 was carried out except for using carbon powder to which 17 parts by weight of cellulose (Abicel PH 302 of Asahi Chemical Industry Co., Ltd.) was added.

COMPARATIVE EXAMPLE 1

The reaction was effected in the same manner as employed in Examples 1 to 5 except for removing the addition of the solid organic compound.

COMPARATIVE EXAMPLE 2

To the starting powder mixture as employed in Examples 1 to 5 was added 400 cc of ethanol containing 15 grams (15 parts by weight) of sucrose, and the same wet mixed with a ball mill. After removing the ethanol, the reaction was effected in the same manner as employed in Examples 1 to 5.

COMPARATIVE EXAMPLE 3

The reaction was effected in the same manner as in Example 6 except that three sheets of urea resin (having a bulk specific gravity of 0.3) of 2 mm in thickness each and 64 g in total (13 parts by weight) were employed, instead of the phenol-formaldehyde resin sheets.

COMPARATIVE EXAMPLE 4

The reaction was effected in the same manner as in Example 7 except that 155 g of aluminum hydroxide (100 g as aluminum) (BHP 39 of Nippon Light Metal Co., Ltd.) and 40 g of carbon were used. The powder was analyzed following the same methods as employed in Examples 1 to 5. The results are shown in Table 1.

TABLE 1

| Starting materials (in parts by weight) | Example 1 | Example 2 | Example 3 | Example 4 | Example 5 | Example 6 | Example 7 | Example 8 | Comparative Example 1 | Comparative Example 2 | Comparative Example 3 | Comparative Example 4 |
|---|---|---|---|---|---|---|---|---|---|---|---|---|
| Alumina Powder | 100 | 100 | 100 | 100 | 100 | 100 | 100 | 100 | 100 | 100 | 100 | 100*[1] |
| Carbon powder | 40 | 40 | 40 | 40 | 40 | 40 | 40 | 40 | 40 | 40 | 40 | 40 |
| Phenol-formaldehyde resin | 7 | 22 | — | — | — | 17 | 6 | — | — | — | — | 6 |
| Polyvinylidene chloride | — | — | 8 | — | — | — | — | — | — | — | — | — |
| Polyphenylene | — | — | — | — | 8 | — | — | — | — | — | — | — |
| Cellulose | — | — | — | 10 | — | — | — | 17 | — | — | — | — |
| Sucrose | — | — | — | — | — | — | — | — | — | 15 | — | — |
| Urea resin | — | — | — | — | — | — | — | — | — | — | 13 | — |
| Average particle diameter of aluminum nitride ($\mu$m) | 3.4 | 3.2 | 3.7 | 3.5 | 3.5 | 3.0 | 3.5 | 3.5 | 5.7 | 4.2 | 5.3 | 5.6 |
| $\alpha$-$Al_2O_3$ content in aluminum nitride (% by weight) | 0.1 | 0.0 | 0.5 | 0.4 | 0.3 | 0.1 | 0.3 | 0.0 | 4.2 | 2.5 | 1.8 | 3.1 |
| Oxygen content in aluminum nitride (% by weight) | 0.6 | 0.5 | 0.9 | 0.9 | 0.7 | 0.6 | 0.8 | 0.5 | 3.6 | 2.1 | 1.7 | 2.8 |

*[1] as alumina

As described above, the process of the present invention for producing aluminum nitride powder by reacting nitrogen gas with a mixture of alumina and carbon with the addition of a solid organic polymer compound to effect a nitridation reduction enables the production of fine-grained aluminum nitride powder with an increased rate of reaction. The thus prepared aluminum nitride powder is suitably used as starting materials that are required to have a fine particle size, such as electrical substrates and the like, and is therefore, extremely useful for the progress in industry.

While the invention has been described in detail and with reference to specific embodiments thereof, it will be apparent to one skilled in the art that various changes and modifications can be made therein without departing from the spirit and scope thereof.

What is claimed is:

1. A process for producing aluminum nitride powder by reacting nitrogen gas with a mixture of alumina powder and carbon powder, wherein a solid organic compound is added to said mixture and the resulting material consisting of the alumina powder, carbon powder and solid organic compound is directly heated in the nitrogen gas, wherein said solid organic compound is directly vaporized upon being heated to yield ultra-fine carbon without melting into the liquid phase upon heating in the nitrogen gas and wherein the addition amount of the solid organic compound is from 5 parts by weight to 25 parts by weight for 100 parts by weight of alumina, wherein the solid organic compound is one or more selected from the group consisting of phenol-formaldehyde resin, polyvinylidene chloride, polyphenylene, and cellulose.

2. The process for producing aluminum nitride powder as claimed in claim 1, wherein alumina having a specific surface area (measured by the BET method) of from 20 $m^2/g$ to 130 $m^2/g$ and with a water content (adsorbed water) of 5.5% by weight or less is used.

3. The process of claim 1, wherein the heating is at a temperature of 1250° C. to 1600° C. for 5 to 30 hours.

4. The process of claim 1, wherein the carbon is carbon black or graphite.

5. The process of claim 1, wherein the solid organic compound, upon being heated, is converted to non-graphitizing carbon of a short bonding length and no preferred orientation.

6. The process of claim 1, wherein the alumina nitride powder is of uniform grain size.

7. The process of claim 1, wherein the oxygen content in the aluminum nitride powder (% by weight) is 0.9 or less.

* * * * *